(12) United States Patent
Zhou

(10) Patent No.: US 12,721,012 B2
(45) Date of Patent: Aug. 25, 2026

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jing Zhou, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 255 days.

(21) Appl. No.: 18/597,853

(22) Filed: Mar. 6, 2024

(65) Prior Publication Data

US 2024/0215397 A1 Jun. 27, 2024

Related U.S. Application Data

(63) Continuation of application No. 17/419,713, filed as application No. PCT/CN2021/097527 on May 31, 2021, now Pat. No. 11,957,031.

(30) Foreign Application Priority Data

May 20, 2021 (CN) ......................... 202110548905.2

(51) Int. Cl.

| | |
|---|---|
| ***H10K 59/80*** | (2023.01) |
| *H10K 59/38* | (2023.01) |
| *H10K 102/00* | (2023.01) |

(52) U.S. Cl.

CPC ......... *H10K 59/873* (2023.02); *H10K 59/871* (2023.02); *H10K 59/38* (2023.02); *H10K 2102/311* (2023.02)

(58) Field of Classification Search

None

See application file for complete search history.

(56) References Cited

U.S. PATENT DOCUMENTS

2019/0318689 A1 10/2019 Kim
2019/0339741 A1* 11/2019 Park .................... H10K 50/844

FOREIGN PATENT DOCUMENTS

CN 106449699 A 2/2017
CN 108682307 A 10/2018

(Continued)

OTHER PUBLICATIONS

Chinese Office Action issued in corresponding Chinese Patent Application No. 202110548905.2 dated Jan. 7, 2022, pp. 1-9.

(Continued)

*Primary Examiner* — Anthony Ho

(74) *Attorney, Agent, or Firm* — PV IP PC; Christopher S. Ruprecht; Wei Te Chung

(57) ABSTRACT

A display device is provided. The display device includes: a flexible screen body including a planar area and a bending area connected to the planar area; a color filter disposed on the flexible screen body and at least covering the planar area; a protective layer disposed on the flexible screen body and at least covering a part of the bending area; and a coverplate disposed on the color filter and at least covering the planar area. The protective layer and the coverplate are arranged at intervals.

19 Claims, 3 Drawing Sheets

(56) References Cited

FOREIGN PATENT DOCUMENTS

| | | | |
|---|---|---|---|
| CN | 108877519 | A | 11/2018 |
| CN | 108962029 | A | 12/2018 |
| CN | 109119453 | A | 1/2019 |
| CN | 109859642 | A | 6/2019 |
| CN | 110047379 | A | 7/2019 |
| CN | 110224081 | A | 9/2019 |
| CN | 111430426 | A | 7/2020 |
| CN | 112289185 | A | 1/2021 |
| CN | 112634764 | A | 4/2021 |
| CN | 112786807 | A | 5/2021 |

OTHER PUBLICATIONS

Chinese Office Action issued in corresponding Chinese Patent Application No. 202110548905.2 dated May 30, 2022, pp. 1-8.

Chinese Rejection Decision issued in corresponding Chinese Patent Application No. 202110548905.2 dated Aug. 5, 2022, pp. 1-5.

International Search Report in International application No. PCT/CN2021/097527, mailed on Nov. 29, 2021.

Written Opinion of the International Search Authority in International application No. PCT/CN2021/097527, mailed on Nov. 29, 2021.

* cited by examiner

DISPLAY DEVICE

CROSS-REFERENCE TO RELATED APPLICATIONS

The present application is a continuation application of U.S. application Ser. No. 17/419,713, filed on Jun. 29, 2021, which is a US national phase application based upon an International Application No. PCT/CN2021/097527, filed on May 31, 2021, which claims priority to Chinese Patent Application No. 202110548905.2, submitted with the Chinese Patent Office on May 20, 2021. The entire disclosures of the above applications are incorporated herein by reference.

FIELD OF INVENTION

The present disclosure relates to the field of display technologies, and more particularly, to a display device.

BACKGROUND OF INVENTION

For organic light-emitting diode (OLED) display panels, although polarizers can effectively reduce reflectivity of the OLED display panels under strong light, they cause the OLED display panels to lose nearly 58% of light extraction efficiency, which greatly increases a burden of service life for the OLED display panels. In addition, a thickness of the polarizers is about 100 μm, which is a greater thickness, and material of the polarizers is brittle, thereby being unbeneficial for development of dynamic bending products.

In order to develop the dynamic bending products based on the OLED display panels, a POL-less technique is usually used to manufacture the OLED display panels. The POL-less technique means a technique using color filters (CFs) to replace the polarizers.

Wherein, the color filters consist of red color resists, green color resists, blue color resists, and a black matrix (BM). In the OLED display panels, the red color resists, the green color resists, and the blue color resists are responsible for light extraction of red sub-pixel units, green sub-pixel units, and blue sub-pixel units, respectively, and the black matrix is mainly responsible for preventing light leakage of the OLED display panels and reducing reflectivity of the OLED display panels. The color filters can not only reduce the reflectivity of the OLED display panels to a certain degree under the strong light, but can also increase the light extraction efficiency of the OLED display panels from 42% to 60%. In addition, a thickness of the color filters is about 5 μm, which is much less than the thickness of the polarizers, and the color filters have high flexibility, thereby reducing a whole thickness of the OLED display panels and being beneficial for the development of the dynamic bending products.

Further, in order to realize a narrow bezel design of the OLED display panels, bending areas of the OLED display panels are usually bent to a back surface of the OLED display panels, thereby reducing a width of bezels. However, bending of the bending areas of the OLED display panels is prone to cause circuit lines in the OLED display panels to break. In order to prevent breakage of the circuit lines caused by bending, the bending areas of the OLED display panels are usually covered by UV glues, so bending stresses in the bending areas of the OLED display panels can be relieved.

However, a thickness of the UV glues is about 95 μm, and since thicknesses of the color filters and optical adhesives are both thin, when coverplates are attached to the color filters by the optical adhesives, the coverplates will squeeze the UV glues, thereby causing the OLED display panels to have a risk of cracking.

Technical problem: the present disclosure provides a display device to solve a problem of current OLED display panels having the risk of cracking.

SUMMARY OF INVENTION

The present disclosure provides a display device, which includes:

- a flexible screen body including a planar area and a bending area connected to the planar area;
- a color filter disposed on the flexible screen body and at least covering the planar area;
- a protective layer disposed on the flexible screen body and at least covering a part of the bending area; and
- a coverplate disposed on the color filter and at least covering the planar area;
- wherein, in an overlapping area of the protective layer and the coverplate, a distance between the protective layer and the coverplate is greater than or equal to a default value.

In some embodiments, the protective layer is disposed on a surface of the flexible screen body, and a thickness of the protective layer on the surface of the flexible screen body is less than or equal to a distance between one side of the coverplate adjacent to the flexible screen body and one side of the flexible screen body adjacent to the coverplate.

In some embodiments, the display device further includes a touch control layer disposed between the flexible screen body and the color filter and an insulating layer disposed between the touch control layer and the color filter; wherein, the protective layer is disposed on a surface of the insulating layer, and a thickness of the protective layer on the surface of the insulating layer is less than or equal to a distance between one side of the coverplate adjacent to the insulating layer and one side of the insulating layer adjacent to the coverplate.

In some embodiments, the protective layer is further disposed on a surface of the color filter, and the thickness of the protective layer on the surface of the color filter is less than or equal to a distance between one side of the coverplate adjacent to the color filter and one side of the color filter adjacent to the coverplate.

In some embodiments, the bending area includes a transitional bending sub-area, a bending sub-area, and an extending bending sub-area connected to the planar area and defined in sequence, and the transitional bending sub-area is flush with the planar area;

- the protective layer completely covers the bending sub-area and covers at least a part of the transitional bending sub-area; and
- the coverplate is connected to the color filter by an optical adhesive, and the coverplate completely covers the planar area and covers at least the part of the transitional bending sub-area.

In some embodiments, wherein a thickness of the optical adhesive is greater than a maximum thickness of the protective layer on the transitional bending sub-area.

In some embodiments, the protective layer further covers at least a part of the extending bending sub-area.

In some embodiments, the protective layer is a UV glue.

In some embodiments, the display device further includes a support layer, wherein, one side of the support layer supports the planar area and the transitional bending sub-area, and another side of the support layer away from the planar area supports the extending bending sub-area.

In some embodiments, the support layer includes a first backplate disposed on one side of the planar area and the transitional bending sub-area away from the coverplate and a second backplate disposed on one side of the transitional bending sub-area away from the protective layer.

In some embodiments, foam is disposed between the first backplate and the second backplate.

In some embodiments, a stiffener plate is disposed between the foam and the second backplate.

In some embodiments, a heat dissipation layer is disposed between the foam and the stiffener plate.

In some embodiments, the default value is greater than 0.

In some embodiments, a distance between one side end of the protective layer adjacent to the planar area and an initial bending position of the flexible screen body is greater than a first default value, wherein, the first default value is greater than or equal to 0, and the initial bending position is a jointed position of the bending sub-area and the transitional bending sub-area.

In some embodiments, a distance between one side end of the protective layer adjacent to the extending bending sub-area and a terminal bending position of the flexible screen body is greater than a second default value, wherein, the second default value is greater than or equal to 0.

In some embodiments, the planar area includes a plurality of red sub-pixel units, green sub-pixel units, and blue sub-pixel units, the color filter includes a plurality of color resists and a black matrix disposed among the color resists, and the color resists include red color resists, green color resists, and blue color resists; and wherein, the red color resists are disposed corresponding to the red sub-pixel units, the green color resists are disposed corresponding to the green sub-pixel units, and the blue color resists are disposed corresponding to the blue sub-pixel units.

In some embodiments, the optical adhesive is an optically clear adhesive (OCA).

In some embodiments, a material of the heat dissipation layer is a metal material or graphite, and the metal material includes one or more combinations of copper foil, aluminum foil, or stainless steel foil.

In some embodiments, the display device further includes a driving unit disposed on one surface of the extending bending sub-area away from the support layer.

Beneficial effect: the display device provided by the present disclosure allows the distance between the protective layer and the coverplate to be greater than or equal to the default value in the overlapping area of the protective layer and the coverplate, so the coverplate will not squeeze the protective layer, thereby preventing a risk of cracking the display device.

DETAILED DESCRIPTION OF PREFERRED EMBODIMENTS

In order to make the purpose, technical solutions, and effects of the present disclosure clearer and more definite, the following further describes the present disclosure in detail with reference to the drawings and embodiments. It should be understood that the specific embodiments described herein are only used to explain the disclosure, and are not used to limit the disclosure.

An embodiment of the present disclosure provides a display device, which may be wearable devices, such as smart bracelets, smart watches, or virtual reality (VR) devices, may be mobile phones, e-books, e-newspapers, TVs, or personal laptops, and may also be bendable and foldable flexible OLED displays or lighting devices. The embodiment of the present disclosure does not specifically limit a specific form of the display device.

Figure 1:
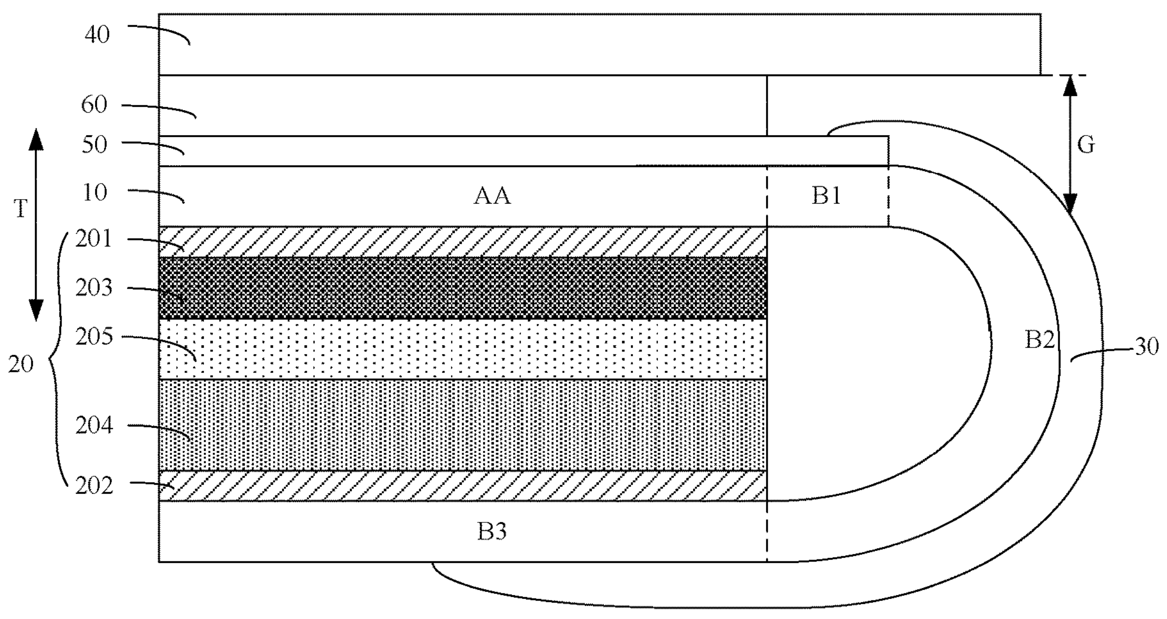
FIG. 1 is a schematic structural diagram of a display device according to an embodiment of the present disclosure.

FIG. 1 is a schematic structural diagram of the display device according to an embodiment of the present disclosure. As shown in FIG. 1, the display device includes a flexible screen body 10, a color filter 50, a protective layer 30, and a coverplate 40. Optionally, the display device can also include a support layer 20 and an optical adhesive 60. The following describes the flexible screen body 10, the support layer 20, the protective layer 30, the coverplate 40, the color filter 50, and the optical adhesive 60 in detail, respectively.

The flexible screen body 10 means a highly flexible screen that can be bent and folded. The flexible screen body 10 can be divided into a planar area AA and a bending area extending from the planar area AA, the planar area AA means an area for displaying, and the bending area means an area that cannot display. The bending area may include a transitional bending sub-area B1, a bending sub-area B2, and an extending bending sub-area B3. Wherein, two opposite ends of the transitional bending sub-area B1 are connected to the planar area AA and the bending sub-area B2, respectively, and two opposite ends of the bending sub-area B2 are connected to the transitional bending sub-area B1 and the extending bending sub-area B3, respectively. Wherein, the transitional bending sub-area B1 is flush with the planar area AA, that is, the transitional bending sub-area B1 and the planar area AA are positioned on a same plane. Both the bending sub-area B2 and the extending bending sub-area B3 are not flush with the planar area AA, that is, the bending sub-area B2 and the planar area AA are positioned on different planes, and the extending bending sub-area B3 and the planar area AA are positioned on different planes.

Specifically, the flexible screen body 10 includes a flexible substrate. The flexible substrate is a substrate made of a flexible material, which is preferably polyimide (PI). The flexible substrate can be divided into a first area and a second area extending from the first area.

A display layer can be integrated in the first area of the flexible substrate and can include a plurality of display components for displaying pictures, so the first area of the flexible substrate and the display layer can together form the planar area AA of the flexible screen body 10. The display layer may include different display components, such as thin film transistors, gate electrode lines, data lines, capacitors, anodes, cathodes, and light-emitting layers. A structure of the planar area AA itself of the flexible screen body 10 in this embodiment has not been improved, and a commonly used structure of the planar area AA in this field may be used, which is not specifically limited in the embodiment.

The second area of the flexible substrate is provided with an integrated circuit configured to achieve signal transmissions and drive picture displays, thereby allowing the second area of the flexible substrate and the integrated circuit to together form the bending area of the flexible screen body 10. A structure of the bending area itself of the flexible screen body 10 in this embodiment has not been improved, and a commonly used structure of the bending area in this field may be used, which is not specifically limited in the embodiment.

In order to realize a narrow bezel design of the display device, the bending area of the flexible screen body 10 is usually bent. As shown in FIG. 1, specifically, the bending sub-area B2 of the flexible screen body 10 is bent by 180°, thereby allowing an entire body consisting of the planar area AA and the transitional bending sub-area B1 to be opposite to and in parallel to the extending bending sub-area B3. At this time, the bending sub-area B2 is semi-circular arc shaped, the planar area AA, the transitional bending sub-area B1, the bending sub-area B2, and the extending bending sub-area B3 form a receiving groove, and the support layer 20 is disposed in the receiving groove.

It should be noted that in one aspect, since the bending area of the flexible screen body 10 includes the transitional bending sub-area B1 defined between the planar area AA and the bending sub-area B2, an initial bending position of the flexible screen body 10 is a jointed position of the bending sub-area B2 and the transitional bending sub-area B1. That is, the initial bending position of the flexible screen body 10 departs from a jointed position of the planar area AA and the bending area, and both sides of the initial bending position are in the bending area, thereby effectively relieving stress concentration caused by different structures on both sides of the initial bending position of the flexible screen body 10 and realizing protection of the initial bending position of the flexible screen body 10. In another aspect, since the bending sub-area B2 is not directly adjacent to the planar area AA and the transitional bending sub-area B1 is defined between them, stresses acting on the planar area AA is reduced when the bending sub-area B2 is bent, thereby protecting the planar area AA, for example, preventing the planar area AA from cracking.

One side of the support layer 20 supports the planar area AA and the transitional bending sub-area B1 of the flexible screen body 10, and another side of the support layer 20 away from the planar area AA supports the extending bending sub-area B3 of the flexible screen body 10. That is, the planar area AA and the transitional bending sub-area B1 of the flexible screen body 10 are disposed on a same side of the support layer 20, and the extending bending sub-area B3 of the flexible screen body 10 is disposed on another side of the support layer 20 away from the planar area AA.

It should be noted that the support layer 20 is mainly configured to fix and support the flexible screen body 10, thereby preventing the bending sub-area B2 of the flexible screen body 10 from breaking due to an overly large degree of bending. The support layer 20 may be a material having both hardness and elasticity, so it can not only support the flexible screen body 10, but can also damp the flexible screen body 10. The support layer 20 may be one layer or a multi-layered structure, and is not specifically limited in the embodiment.

The protective layer 30 is disposed on one side of the flexible screen body 10 away from the support layer 20 and covers at least a part of the bending area. The protective layer 30 shown in FIG. 1 completely covers the bending sub-area B2 of the flexible screen body 10 and covers at least a part of the transitional bending sub-area B1 of the flexible screen body 10. Wherein, the protective layer 30 shown in FIG. 1 completely covers the bending sub-area B2 and the transitional bending sub-area B1 of the flexible screen body 10. Of course, in other embodiments, the protective layer 30 may also completely cover the bending sub-area B2 of the flexible screen body 10 and covers the part of the transitional bending sub-area B1.

It should be noted that the protective layer 30 completely covers the bending sub-area B2 of the flexible screen body 10, thereby relieving bending stresses of the bending sub-area B2. The protective layer 30 covers at least the part of the transitional bending sub-area B1 of the flexible screen body 10, thereby allowing the protective layer 30 to better relieve bending stresses of the initial bending position of the flexible screen body 10 from one side of the initial bending position of the flexible screen body 10 adjacent to the planar area AA.

It should be noted that a distance between one side end of the protective layer 30 adjacent to the planar area AA and the initial bending position of the flexible screen body 10 may be greater than a first default value. Wherein, the first default value is a value greater than or equal to 0 and may be flexibly adjusted according to actual needs, and is not specifically limited in the embodiment.

The planar area AA of the flexible screen body 10 includes red sub-pixel units, green sub-pixel units, and blue sub-pixel units. Wherein, the red sub-pixel units are configured to emit red light, the green sub-pixel units are configured to emit green light, and the blue sub-pixel units are configured to emit blue light.

The color filter 50 is disposed on the side of the flexible screen body 10 away from the support layer 20 and at least covers the planar area AA. The color filter 50 is configured to replace polarizers and is responsible for preventing light leakage of the display device and reducing reflectivity of the display device.

Specifically, the color filter 50 includes a plurality of color resists and a black matrix disposed among the color resists, and the color resists include red color resists, green color resists, and blue color resists. Wherein, the red color resists are disposed corresponding to the red sub-pixel units and are responsible for light extraction of the red sub-pixel units; the green color resists are disposed corresponding to the green sub-pixel units and are responsible for light extraction of the green sub-pixel units; the blue color resists are disposed corresponding to the blue sub-pixel units and are responsible for light extraction of the blue sub-pixel units; and the black matrix is mainly responsible for preventing the light leakage of the display device and reducing the reflectivity of the display device.

The coverplate 40 is disposed on one side of the color filter 50 away from the flexible screen body 10 and at least covers the planar area AA. The coverplate 40 shown in FIG. 1 is connected to the color filter 50 by the optical adhesive 60. The optical adhesive 60 is configured to bond optical elements and may be an optically clear adhesive (OCA) that has characteristics of transparency, light transmittance above 90%, good bonding strength, ability to be cured at room temperature or a moderate temperature, and small curing shrinkage. In this embodiment, the optical adhesive 60 is configured to bond the coverplate 40 and the color filter 50.

The coverplate 40 is configured to protect the flexible screen body 10, thereby preventing it from being damaged by external impact.

In an overlapping area of the protective layer 30 and the coverplate 40 of the display device provided by the embodiment of the present disclosure, a distance between the protective layer 30 and the coverplate 40 is greater than or equal to a default value. It should be noted that the default value is a value greater than 0 and may be flexibly adjusted according to actual needs, and is not specifically limited in the embodiment. Therefore, the coverplate 40 will not squeeze the protective layer 30, thereby preventing a risk of cracking the display device.

Figure 2:
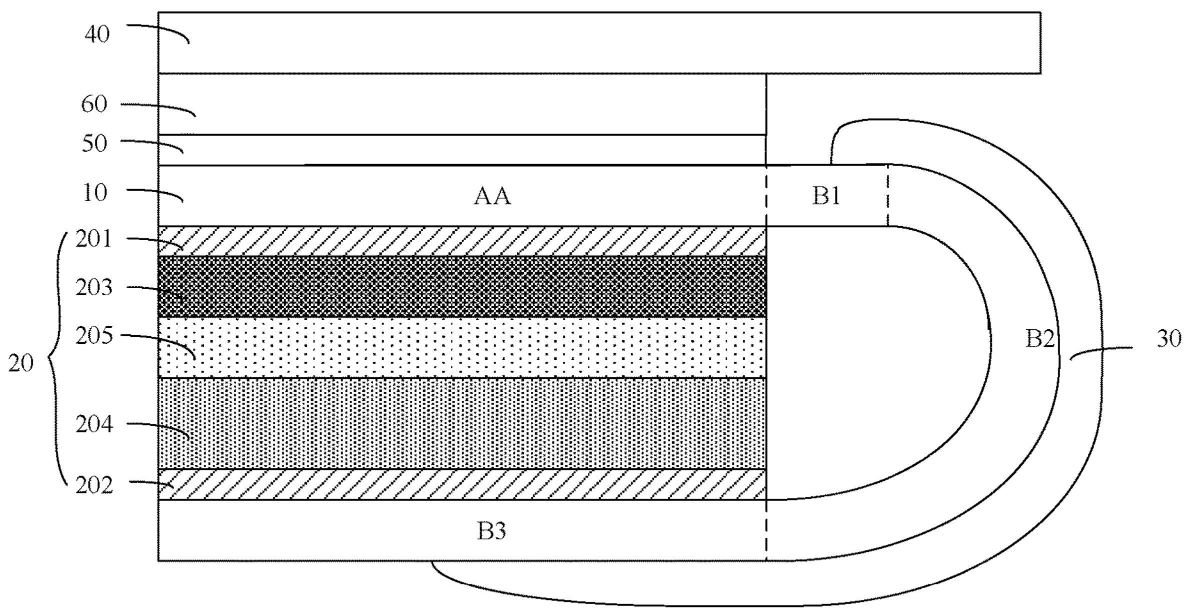
FIG. 2 is a schematic structural diagram of the display device according to another embodiment of the present disclosure.

Based on the above embodiments, referring to FIG. 2, the protective layer 30 is disposed only on a surface of the flexible screen body 10, and a thickness of the protective layer 30 on the surface of the flexible screen body 10 is less than or equal to a distance between one side of the coverplate 40 adjacent to the flexible screen body 10 and one side of the flexible screen body 10 adjacent to the coverplate 40.

Figure 3:
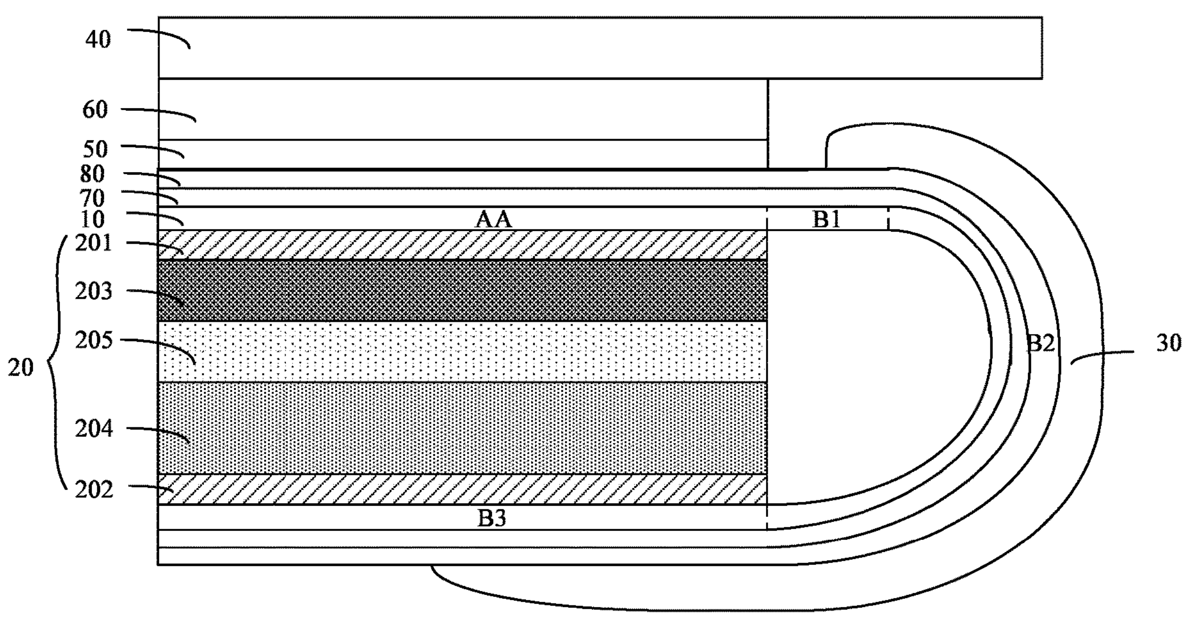
FIG. 3 is a schematic structural diagram of the display device according to yet another embodiment of the present disclosure.

Based on the above embodiments, referring to FIG. 3, the display device further includes a touch control layer 70 disposed between the flexible screen body 10 and the color filter 50 and an insulating layer 80 disposed between the touch control layer 70 and the color filter 50. The protective layer 30 is disposed only on a surface of the insulating layer 80, and the thickness of the protective layer 30 on the surface of the insulating layer 80 is less than or equal to a distance between one side of the coverplate 40 adjacent to the insulating layer 80 and one side of the insulating layer 80 adjacent to the coverplate 40.

Figure 4:
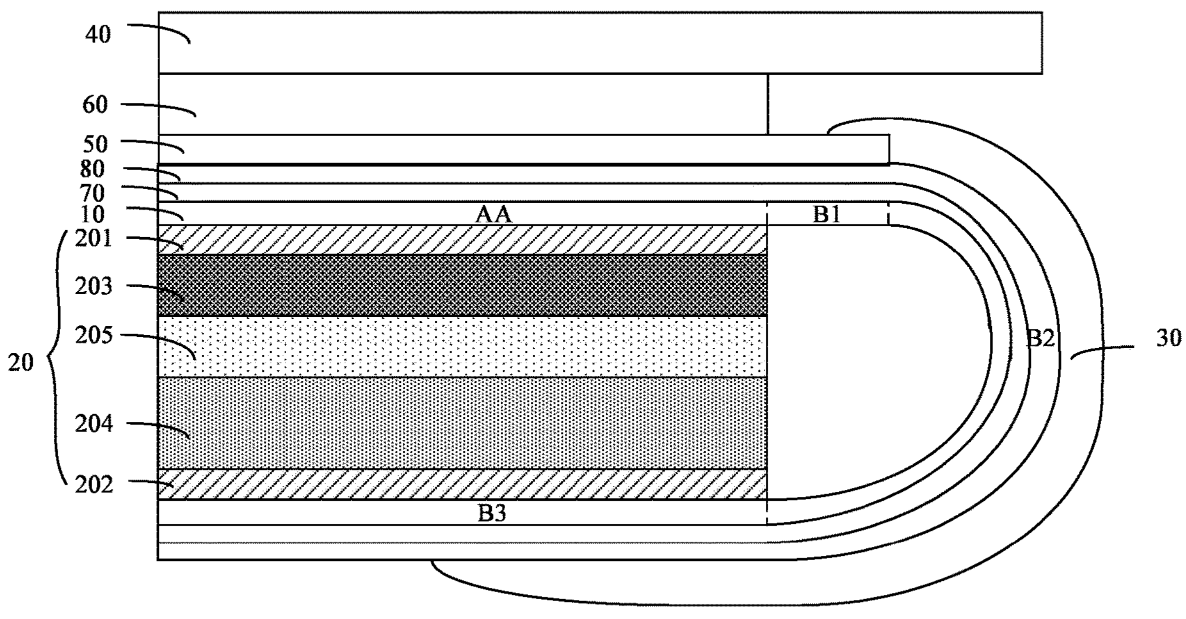
FIG. 4 is a schematic structural diagram of the display device according to still another embodiment of the present disclosure.

Based on the above embodiments, referring to FIGS. 1 and 4, the protective layer 30 is further disposed on a surface of the color filter 50, and the thickness of the protective layer 30 on the surface of the color filter 50 is less than or equal to a distance between one side of the coverplate 40 adjacent to the color filter 50 and one side of the color filter 50 adjacent to the coverplate 40. Referring to FIG. 1 again, for example, there is a gap G between the protective layer 30 and the coverplate in the thickness direction T of the display device.

Based on the above embodiments, in this embodiment, a thickness of the optical adhesive 60 is greater than a maximum thickness of the protective layer 30 on the transitional bending sub-area B1 of the flexible screen body 10. Therefore, it can ensure that a predetermined spacing is between the coverplate 40 covering the transitional bending sub-area B1 of the flexible screen body 10 and the protective layer 30 covering the transitional bending sub-area B1 of the flexible screen body 10. Therefore, the coverplate 40 will not squeeze the protective layer 30, thereby preventing the risk of cracking the display device.

Based on the above embodiments, the display device of the embodiment will be further described. The protective layer 30 further covers at least a part of the extending bending sub-area B3 of the flexible screen body 10, thereby better relieving bending stresses of a terminal bending position of the flexible screen body 10. It should be noted that a distance between one side end of the protective layer 30 adjacent to the extending bending sub-area B3 and the terminal bending position of the flexible screen body 10 may also be greater than a second default value. Wherein, the second default value is a value greater than or equal to 0 and may be flexibly adjusted according to actual needs, and is not specifically limited in the embodiment. Wherein, the protective layer 30 shown in FIG. 1 covers the part of the extending bending sub-area B3 of the flexible screen body 10. Of course, in other embodiments, the protective layer 30 may also completely cover the extending bending sub-area B3 of the flexible screen body 10.

Based on the above embodiments, in some embodiments, the protective layer 30 is a UV glue. Of course, in other embodiments, the protective layer 30 is not limited to the UV glue and may also be thermal curing adhesives or other kinds of photo curing adhesives, and is not specifically limited in the embodiment. It should be noted that in a case that the distance between the coverplate 40 and the protective layer 30 is greater than 0, a skilled person in the art can set a suitable thickness for the protective layer 30 according to a size and type of the flexible screen body 10, a bending radius of the bending sub-area B2, flexibility and an ability to relieve stresses of the protective layer 30, and is not specifically limited in the embodiment.

Based on the above embodiments, the display device of the embodiment will be further described. The support layer 20 includes a first backplate 201 disposed on one side of the planar area AA and the transitional bending sub-area B1 of the flexible screen body 10 that are away from the cover plate 40, and a second backplate 202 disposed on one side of the extending bending sub-area B3 of the flexible screen body 10 that is away from the protective layer 30. Wherein, the extending bending sub-area B3 may be fixed onto the second backplate 202 by gluing or physical methods.

The first backplate 201 is configured to support and protect the planar area AA and the transitional bending sub-area B1 of the flexible screen body 10, thereby preventing them from being damaged by the external impact. The second backplate 202 is configured to support and protect the extending bending sub-area B3 of the flexible screen body 10, thereby preventing it from being damaged by the external impact. Materials of the first backplate 201 and the second backplate 202 may be polyethylene terephthalate (PET) material. Since the PET material has advantages of low elastic modulus and not easily expanding when heated, the first backplate 201 and the second backplate 202 manufactured using the PET material will not deform with changes of an environment temperature, which reduces a probability of peeling between the first backplate 201 and film layers that are connected thereto and reduces a probability of peeling between the second backplate 202 and film layers that are connected thereto, thereby improving yields and reliability of the display device.

Further, in order to prevent the first backplate 201 and the second backplate 202 from affecting bending of the bending sub-area B2 of the flexible screen body 10, it must be ensured that the first backplate 201 and the second backplate 202 both avoid the bending sub-area B2. Preferably, in order to better support the planar area AA and the transitional bending sub-area B1 of the flexible screen body 10, an edge of the first backplate 201 coincides with the initial bending position of the flexible screen body 10. Similarly, in order to better support the extending bending sub-area B3 of the flexible screen body 10, an edge of the second backplate 202 coincides with the terminal bending position of the flexible screen body 10.

Based on the above embodiments, in some embodiments, the support layer 20 further includes a height-increased block disposed between the first backplate 201 and the second backplate 202. A height of the height-increased block may be adjusted according to a width of the bending sub-area B2 of the flexible screen body 10, and is not specifically limited in the embodiment. The height-increased block may be a material, such as silica gel, and may have certain elasticity and hardness. The height-increased block has certain hardness to prevent the flexible screen body 10 from being squeezed and deformed, and has certain elasticity to prevent the flexible screen body 10 from being damaged by local stresses.

Specifically, the height-increased block is disposed avoiding the bending sub-area B2 of the flexible screen body 10. Of course, in other embodiments, one surface of one end of the height-increased block adjacent to the bending sub-area B2 of the flexible screen body 10 matches a shape of the bending sub-area B2 after bending, which allows one side surface of the bending sub-area B2 adjacent to the height-increased block to fit with the surface of the height-increased block, thereby having a certain supporting effect on the bending sub-area B2 and being uneasy to deform and to be damaged. It can be understood that in other embodiments, a distance between the planar area AA and the extending bending sub-area B3 of the flexible screen body 10 can be ensured by increasing thicknesses of the first backplate 201 and the second backplate 202 or adding other supporting structures.

Based on the above embodiments, in some embodiments, a foam 203 is disposed between the first backplate 201 and the second backplate 202. It should be noted that the foam 203 is a foamed material of plastic particles, and it can play a role of buffering and shielding light.

Based on the above embodiments, in some embodiments, a stiffener plate 204 is disposed between the foam 203 and the second backplate 202. It should be noted that the stiffener plate 204 is configured to improve strength of the flexible screen body 10. Wherein, the stiffener plate 204 may be a polyimide layer or a graphite layer. Wherein, an outer surface of the graphite layer may also be covered using polyimide, and is not specifically limited in the embodiment.

Based on the above embodiments, in some embodiments, a heat dissipation layer 205 is disposed between the foam 203 and the stiffener plate 204. Wherein, the heat dissipation layer 205 plays a role of shielding and heat dissipating, and a material of the heat dissipation layer 205 is a heat dissipating material and specifically may be a metal material or graphite. Wherein, the metal material may be copper foil, aluminum foil, or stainless steel foil, and it is not specifically limited in the embodiment.

Based on the above embodiments, in some embodiments, the display device further includes a driving unit disposed on the extending bending sub-area B3. Specifically, the driving unit is disposed on a surface of the extending bending sub-area B3 of the flexible screen body 10 away from the support layer 20. The driving unit includes a driving chip and a flexible circuit board. Wherein, the driving chip and the flexible circuit board are both disposed on the surface of the extending bending sub-area B3 of the flexible screen body 10 away from the support layer 20, and a distance between the flexible circuit board and the driving chip is greater than 0.

Based on the above embodiments, in some embodiments, the planar area AA of the flexible screen body 10 includes the flexible substrate, the thin film transistors, display components, and an encapsulation layer. Wherein, the flexible substrate is disposed on the first backplate 201, the thin film transistors are disposed on the flexible substrate, the display components are disposed on the thin film transistors, and the encapsulation layer is disposed on the display components.

The flexible substrate is the substrate made of the flexible material, which is preferably polyimide (PI).

The display components are configured to emit light and usually include the anodes disposed on the thin film transistors, hole injection layers (HILs) disposed on the anodes, hole transport layers (HTLs) disposed on the hole injection layers, light-emitting layers (emission layers, EMLs) disposed on the hole transport layers, electron transport layers (ETLs) disposed on the light-emitting layers, electron injection layers (EILs) disposed on the electron transport layers, and the cathodes disposed on the electron injection layers. Optionally, hole blocking layers (HBLs), electron blocking layers (EBLs), and capping layers (CPLs) may also be disposed in the display components.

The light-emitting layers include the red sub-pixel units, the green sub-pixel units, and the blue sub-pixel units. Wherein, the red sub-pixel units are configured to emit the red light, the green sub-pixel units are configured to emit the green light, and the blue sub-pixel units are configured to emit the blue light.

The color filter 50 is configured to replace the polarizers and is responsible for preventing the light leakage of the display device and reducing the reflectivity of the display device. Specifically, the color filter 50 includes the plurality of color resists and the black matrix disposed among the color resists, and the color resists include the red color resists, the green color resists, and the blue color resists. Wherein, the red color resists are disposed corresponding to the red sub-pixel units and are responsible for the light extraction of the red sub-pixel units; the green color resists are disposed corresponding to the green sub-pixel units and are responsible for the light extraction of the green sub-pixel units; the blue color resists are disposed corresponding to the blue sub-pixel units and are responsible for the light extraction of the blue sub-pixel units; and the black matrix is mainly responsible for preventing the light leakage of the display device and reducing the reflectivity of the display device.

The encapsulation layer is configured to isolate external water and oxygen for the display device, thereby ensuring the yields of the display devices. The encapsulation layer is usually a sandwich structure composed of an organic layer, an inorganic layer, and another organic layer.

Figure 5:
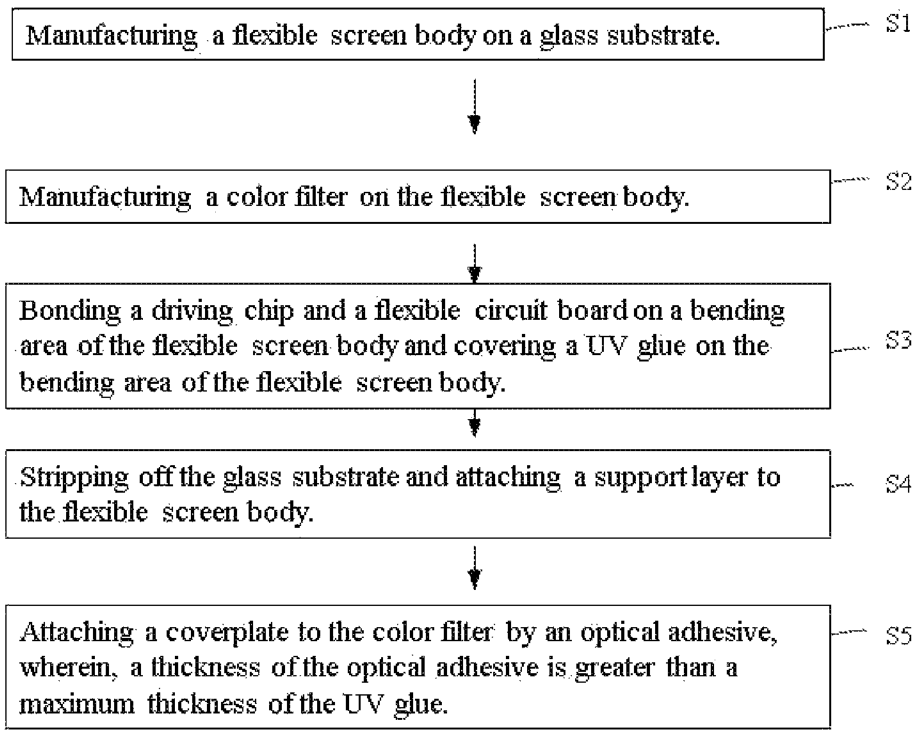
FIG. 5 is a flowchart of a manufacturing method of the display device according to an embodiment of the present disclosure.

Based on the above embodiments, a manufacturing method of the display device mentioned above in the embodiments is described in this embodiment. FIG. 5 is a flowchart of the manufacturing method of the display device according to an embodiment of the present disclosure. As shown in FIG. 5, the manufacturing method includes following steps.

S1: manufacturing the flexible screen body 10 on a glass substrate.

The flexible screen body 10 means the highly flexible screen that can be bent and folded. The flexible screen body 10 can be divided into the planar area AA and the bending area extending from the planar area AA, the planar area AA means the area for displaying, and the bending area means the area that cannot display. The bending area includes the transitional bending sub-area B1, the bending sub-area B2, and the extending bending sub-area B3.

Wherein, the two opposite ends of the transitional bending sub-area B1 are connected to the planar area AA and the bending sub-area B2, respectively, and the two opposite ends of the bending sub-area B2 are connected to the transitional bending sub-area B1 and the extending bending sub-area B3, respectively. Wherein, the transitional bending sub-area B1 is flush with the planar area AA, that is, the transitional bending sub-area B1 and the planar area AA are positioned on the same plane. Both the bending sub-area B2 and the extending bending sub-area B3 are not flush with the planar area AA, that is, the bending sub-area B2 and the planar area AA are positioned on different planes, and the extending bending sub-area B3 and the planar area AA are positioned on different planes.

S2: manufacturing the color filter 50 on the flexible screen body 10.

Specifically, the planar area AA of the flexible screen body 10 includes the red sub-pixel units, the green sub-pixel units, and the blue sub-pixel units. The color filter 50 includes the plurality of color resists and the black matrix disposed among the color resists, and the color resists include the red color resists, the green color resists, and the blue color resists. The red color resists are disposed corresponding to the red sub-pixel units, the green color resists are disposed corresponding to the green sub-pixel units, and the blue color resists are disposed corresponding to the blue sub-pixel units. It should be noted that in some embodiments, a planarization layer may be manufactured on the color filter 50 to planarize the color filter 50.

S3: bonding the driving chip and the flexible circuit board on the bending area of the flexible screen body 10 and covering the UV glue on the bending area of the flexible screen body 10.

Specifically, the driving chip and the flexible circuit board are both disposed on the surface of the extending bending sub-area B3 of the flexible screen body 10 away from the support layer 20, and the distance between the flexible circuit board and the driving chip is greater than 0. The bending area of the flexible screen body 10 is covered by the UV glue to allow the UV glue to completely cover the bending sub-area B2 and to cover at least the part of the transitional bending sub-area B1.

S4: stripping off the glass substrate and attaching the support layer 20 to the flexible screen body 10.

Specifically, the side of the support layer 20 supports the planar area AA and the transitional bending sub-area B1 of the flexible screen body 10, and the another side of the support layer 20 away from the planar area AA supports the extending bending sub-area B3 of the flexible screen body 10. That is, the planar area AA and the transitional bending sub-area B1 of the flexible screen body 10 are disposed on the same side of the support layer 20, and the extending bending sub-area B3 of the flexible screen body 10 is disposed on the another side of the support layer 20 away from the planar area AA. It should be noted that the support layer 20 is mainly configured to fix and support the flexible screen body 10, thereby preventing the bending sub-area B2 of the flexible screen body 10 from breaking due to the overly large degree of bending. The support layer 20 may be the material having both hardness and elasticity, so it can not only support the flexible screen body 10, but can also damp the flexible screen body 10. The support layer 20 may be one layer or the multi-layered structure, and is not specifically limited in the embodiment.

S5: attaching the coverplate 40 to the color filter 50 by the optical adhesive 60, wherein, the thickness of the optical adhesive 60 is greater than the maximum thickness of the UV glue.

Specifically, the coverplate 40 is attached to the color filter 50 using the optical adhesive 60 to allow the coverplate 40 to completely cover the planar area AA of the flexible screen body 10 and to cover at least the part of the transitional bending sub-area B1 of the flexible screen body 10. Since the thickness of the optical adhesive 60 is greater than the maximum thickness of the UV glue, the coverplate 40 will not generate pressures on the UV glue during a bonding process of the coverplate 40 and the color filter 50, thereby reducing a module processing risk of the display device.

It should be noted that the numbers of the above steps do not strictly represent the order of executing the steps. In some embodiments, the corresponding steps can be executed strictly according to the order of the numbers of the above steps. Of course, in other embodiments, some steps may be executed at a same time or executed in a reverse order, which is not specifically limited in the embodiment of the present disclosure.

It can be understood that for a person of ordinary skill in the art, equivalent replacements or changes can be made according to the technical solution of the present disclosure and its inventive concept, and all these changes or replacements should fall within the protection scope of the claims attached to the present disclosure.

What is claimed is:

1. A display device, comprising:

a flexible screen body comprising a planar area and a bending area connected to the planar area;

a color filter disposed on the flexible screen body and at least covering the planar area;

a protective layer disposed on the flexible screen body and at least covering a part of the bending area; and a coverplate disposed on the color filter and at least covering the planar area;

wherein the protective layer is spaced apart from the coverplate in a thickness direction of the display device;

wherein the protective layer comprises a part disposed on a surface of the flexible screen body and a part disposed on a surface of the color filter, and a thickness of the part of the protective layer on the surface of the color filter is less than a distance between one side of the coverplate adjacent to the color filter and one side of the color filter adjacent to the coverplate.

2. The display device according to claim 1, wherein in an overlapping area of the protective layer and the coverplate, a distance between the protective layer and the coverplate is greater than or equal to a default value, wherein the default value is greater than 0.

3. The display device according to claim 1, wherein a thickness of the part of the protective layer on the surface of the flexible screen body is less than a distance between one side of the coverplate adjacent to the flexible screen body and one side of the flexible screen body adjacent to the coverplate.

4. The display device according to claim 1, further comprising a touch control layer disposed between the flexible screen body and the color filter and an insulating layer disposed between the touch control layer and the color filter; wherein the protective layer is disposed on a surface of the insulating layer, and a thickness of the protective layer on the surface of the insulating layer is less than a distance between one side of the coverplate adjacent to the insulating layer and one side of the insulating layer adjacent to the coverplate.

5. The display device according to claim 1, wherein the bending area comprises a transitional bending sub-area, a bending sub-area, and an extending bending sub-area defined in sequence, and the transitional bending sub-area is connected to and flush with the planar area;

the protective layer completely covers the bending sub-area and covers at least a part of the transitional bending sub-area; and the coverplate is connected to the color filter by an optical adhesive, and the coverplate completely covers the planar area and covers at least the part of the transitional bending sub-area.

6. The display device according to claim 5, wherein a thickness of the optical adhesive is greater than a maximum thickness of the protective layer on the transitional bending sub-area.

7. The display device according to claim 5, wherein the protective layer further covers at least a part of the extending bending sub-area.

8. The display device according to claim 5, wherein the protective layer is a UV glue.

9. The display device according to claim 5, further comprising:

a support layer, wherein one side of the support layer supports the planar area and the transitional bending sub-area, and another side of the support layer away from the planar area supports the extending bending sub-area.

10. A display device, comprising:

a flexible screen body comprising a planar area and a bending area connected to the planar area;

a color filter disposed on the flexible screen body and at least covering the planar area;

a protective layer disposed on the flexible screen body and at least covering a part of the bending area; and a coverplate disposed on the color filter and at least covering the planar area;

wherein the protective layer is spaced apart from the coverplate in a thickness direction of the display device;

wherein the bending area comprises a transitional bending sub-area, a bending sub-area, and an extending bending sub-area defined in sequence, and the transitional bending sub-area is connected to and flush with the planar area;

the protective layer completely covers the bending sub-area and covers at least a part of the transitional bending sub-area; and the coverplate is connected to the color filter by an optical adhesive, and the coverplate completely covers the planar area and covers at least the part of the transitional bending sub-area;

the display device further comprises:

a support layer, wherein one side of the support layer supports the planar area and the transitional bending sub-area, and another side of the support layer away from the planar area supports the extending bending sub-area;

wherein the support layer comprises a first backplate disposed on one side of the planar area and the transitional bending sub-area away from the coverplate and a second backplate disposed on one side of the extending bending sub-area away from the protective layer.

11. The display device according to claim 10, wherein a foam is disposed between the first backplate and the second backplate.

12. The display device according to claim 11, wherein a stiffener plate is disposed between the foam and the second backplate.

13. The display device according to claim 12, wherein a heat dissipation layer is disposed between the foam and the stiffener plate.

14. The display device according to claim 5, wherein a distance between one side end of the protective layer adjacent to the planar area and an initial bending position of the flexible screen body is greater than a first default value, wherein the first default value is greater than or equal to 0, and the initial bending position is a jointed position of the bending sub-area and the transitional bending sub-area.

15. The display device according to claim 14, wherein a distance between one side end of the protective layer adjacent to the extending bending sub-area and a terminal bending position of the flexible screen body is greater than a second default value, wherein the second default value is greater than or equal to 0.

16. A display device, comprising:

a flexible screen body comprising a planar area and a bending area connected to the planar area;

a color filter disposed on the flexible screen body and at least covering the planar area;

a protective layer disposed on the flexible screen body and at least covering a part of the bending area; and a coverplate disposed on the color filter and at least covering the planar area;

wherein the protective layer is spaced apart from the coverplate in a thickness direction of the display device;

wherein the planar area comprises a plurality of red sub-pixel units, green sub-pixel units, and blue sub-pixel units, the color filter comprises a plurality of color resists and a black matrix disposed among the color resists, and the color resists comprise red color resists, green color resists, and blue color resists; and wherein the red color resists are disposed corresponding to the red sub-pixel units, the green color resists are disposed corresponding to the green sub-pixel units, and the blue color resists are disposed corresponding to the blue sub-pixel units.

17. The display device according to claim 5, wherein the optical adhesive is an optically clear adhesive (OCA).

18. The display device according to claim 13, wherein a material of the heat dissipation layer is a metal material or graphite, and the metal material comprises one or more combinations of copper foil, aluminum foil, or stainless steel foil.

19. The display device according to claim 9, further comprising a driving unit disposed on one surface of the extending bending sub-area away from the support layer.

* * * * *